United States Patent
Du Plessis et al.

(10) Patent No.: US 9,515,227 B2
(45) Date of Patent: Dec. 6, 2016

(54) NEAR INFRARED LIGHT SOURCE IN BULK SILICON

(75) Inventors: Monuko Du Plessis, Pretoria (ZA); Alfons Willi Bogalecki, Pretoria (ZA)

(73) Assignee: INSIAVA (PTY) LIMITED, Pretoria (ZA)

( * ) Notice: Subject to any disclaimer, the term of this patent is extended or adjusted under 35 U.S.C. 154(b) by 0 days.

(21) Appl. No.: 14/345,102

(22) PCT Filed: Sep. 12, 2012

(86) PCT No.: PCT/IB2012/054740
§ 371 (c)(1),
(2), (4) Date: May 5, 2014

(87) PCT Pub. No.: WO2013/038346
PCT Pub. Date: Mar. 21, 2013

(65) Prior Publication Data
US 2014/0231678 A1    Aug. 21, 2014

(30) Foreign Application Priority Data
Sep. 16, 2011   (ZA) .................................. 2011/06784

(51) Int. Cl.
*H01L 33/60* (2010.01)
*H01L 33/34* (2010.01)
(Continued)

(52) U.S. Cl.
CPC .............. *H01L 33/34* (2013.01); *H01L 25/167* (2013.01); *H01L 33/0054* (2013.01); *H01L 33/60* (2013.01); *H01L 2924/0002* (2013.01)

(58) Field of Classification Search
CPC ........... B82Y 20/00; H01L 2924/00014; H01L 27/14603; H01L 2924/0002; H01L 31/107; H01L 31/1075; H01L 31/1844; H01L 33/34; H01L 33/60; H01L 25/16; Y02E 10/544
(Continued)

(56) References Cited

U.S. PATENT DOCUMENTS 5,994,720 A    11/1999   Snyman et al.
6,111,271 A    8/2000    Snyman et al.
(Continued)

FOREIGN PATENT DOCUMENTS

WO    WO 2009/047716    4/2009
WO    WO 2010/110781    9/2010

OTHER PUBLICATIONS

U.S. Appl. No. 12/140,597, filed Oct. 20, 2010 Du Plessis, et al.
(Continued)

*Primary Examiner* — Chuong A Luu
*Assistant Examiner* — Rodolfo D Fortich
(74) *Attorney, Agent, or Firm* — Nixon & Vanderhye PC

(57) ABSTRACT

A light emitting device (10) comprises a body (12) of a semiconductor material having a first face (14) and at least one other face (16). At least one pn-junction (18) in the body is located towards the first face and is configured to be driven via contacts on the body into a light emitting mode. The other face (16) of the body is configured to transmit from the body light emitted by the at least one pn-junction (18) in the near infrared part of the spectrum and having wavelengths longer than 1 µm.

19 Claims, 1 Drawing Sheet

(51) Int. Cl.
*H01L 33/00* (2010.01)
*H01L 25/16* (2006.01)

(58) Field of Classification Search
USPC .................................. 257/80, 98, 86, 84, 21
See application file for complete search history.

(56) References Cited

U.S. PATENT DOCUMENTS

| | | | |
|---|---|---|---|
| 8,362,679 | B2 | 1/2013 | Du Plessis |
| 8,395,226 | B2 | 3/2013 | Du Plessis |
| 8,669,564 | B2 | 3/2014 | Du Plessis |
| 8,674,382 | B2 | 3/2014 | Snyman et al. |
| 2002/0185700 | A1* | 12/2002 | Coffa ................. H01L 31/0288 257/431 |
| 2002/0191464 | A1* | 12/2002 | Chernobrod ........... G11C 13/04 365/215 |
| 2011/0031893 | A1 | 2/2011 | Snyman et al. |
| 2011/0042701 | A1 | 2/2011 | Du Plessis et al. |
| 2012/0009709 | A1 | 1/2012 | Du Plessis |
| 2013/0026534 | A1 | 1/2013 | Venter |
| 2013/0214293 | A1 | 8/2013 | Du Plessis et al. |

OTHER PUBLICATIONS

U.S. Appl. No. 13/161,113, filed Jun. 15, 2011 Du Plessis.
U.S. Appl. No. 12/863,743, filed Oct. 18, 2010 Snyman, et al.
U.S. Appl. No. 13/574,333, filed Oct. 10, 2012 Venter.
U.S. Appl. No. 13/810,809, filed Apr. 1, 2013 Du Plessis, et al.
International Search Report for PCT/IB2012/054740 mailed Dec. 10, 2012.
Written Opinion of the International Searching Authority mailed Dec. 10, 2012.
Written Opinion of the International Searching Authority mailed Sep. 17, 2013.
M. Remmach e al., "Light Emission to Time Resolved Emission for IC Debug and Failure Analysis", Microelectronics and Reliability, Elsevier Science, vol. 45, No. 9-11, Sep. 1, 2005.
G. Deboy et al., "Fundamentals of Light Emission from Silicon Devices", Semiconductor Science and Technology, vol. 9, No. 5, May 2, 1994, pp. 1017-1032.
B. Huang et al., "CMOS Monolithic Optoelectronic Integrated Circuit for On-Chip Optical Interconnection", Optics Communications, vol. 284, No. 16, Apr. 12, 2011, pp. 3924-3927.
A. Chynoweth et al., "Photon Emission from Avalanche Breakdown in Silicon", Physical Review, American Institute of Physics, vol. 102, No. 2, Apr. 15, 1956, pp. 369-376.
J. Kramer et al., "Industrial CMOS Technology for the Integration of Optical Metrology Systems (Photo-ASICs)", Sensors and Actuators A, Elsevier Sequoia S.A., vol. 34, No. 1, Jul. 1, 1992, pp. 21-30.
N. Akil et al., "Photon Generation by Silicon Diodes in Avalanche Breakdown", Applied Physics Letters, AUP, American Institute of Physics, vol. 73, No. 7, Aug. 17, 1998.
N. Akil et al., "A Multimechanism Model for Photon Generation by Silicon Junctions in Avalanche Breakdown", IEEE Transactions on Electron Devices, IEEE Service Center, vol. 46, No. 5, May 1, 1999, 9 pages.
C. Hong-Da et al., "Silicon Light Emitting Devices on CMOS Technology", Chinese Physics Letters, vol. 24, No. 1, Jan. 1, 2007, pp. 265-267.
M. Du et al., "Silicon Light Emitting Devices in Standard CMOS Technology", 2001 International Semiconductor Conference, CAS 2001 Proceedings (Cat. No. 01TH8547), vol. 1, Jan. 1, 2001, pp. 231-238.

* cited by examiner

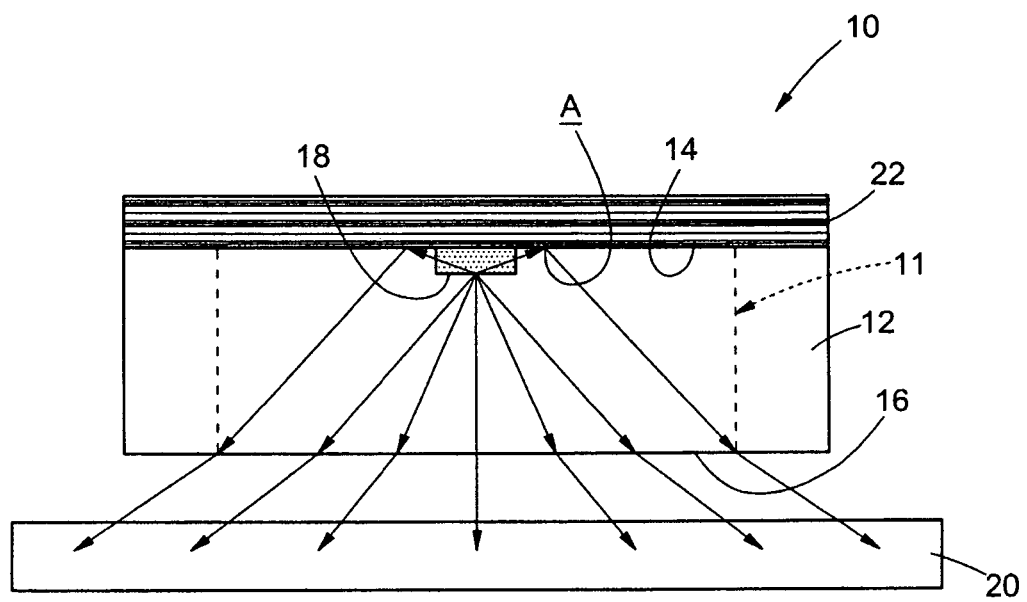

NEAR INFRARED LIGHT SOURCE IN BULK SILICON

This application is the U.S. national phase of International Application No. PCT/IB2012/054740, filed 12 Sep. 2012, which designated the U.S. and claims priority to ZA 2011/06784, filed 16 Sep. 2011, the entire contents of each of which are hereby incorporated by reference.

INTRODUCTION AND BACKGROUND

This invention relates to a light emitting device, a method of fabricating a light emitting device, an integrated circuit comprising a light source and a method of coupling emitted light out of a device comprising a light source.

It is known that forward-biased silicon pn-junctions emit light in a narrow band around 1.1 μm, but this radiation can only be electrically switched at speeds up to a few hundred kHz, which makes it unsuitable for optical communication systems.

On the other hand, reverse-biased avalanching silicon pn-junctions emit light in a wide band from 350 nm to 1.7 μm, with a peak at about 700 nm and can be switched at GHz speeds. However, devices with these junctions have a lower electroluminescent efficiency than devices with forward-biased silicon pn-junctions.

While standard CMOS silicon semiconductor manufacturing processes are used worldwide for many microelectronic devices, the devices are relatively inefficient at generating light and it is difficult to couple generated light out of a CMOS integrated circuit (IC). A first or top face of the CMOS IC is usually covered with various layers of insulating silicon dioxide ($SiO_2$) and metal interconnect with usually uneven topographies. These layers and topographies inhibit the out-coupling of light from the IC and misdirect and distort the external radiation pattern of the exiting light.

OBJECT OF THE INVENTION

Accordingly, it is an object of the present invention to provide a light emitting device, a method of fabricating a light emitting device, an integrated circuit comprising a light source and a method of coupling emitted light out of a device comprising a light source with which the applicant believes the aforementioned disadvantages may at least be alleviated or which may provide a useful alternative to known devices and methods.

SUMMARY OF THE INVENTION

According to the invention there is provided a light emitting device comprising:
  a body of an indirect bandgap semiconductor material having a first face and at least one other face;
  at least one pn-junction in the body located towards the first face and configured to be driven via, contacts on the body into a light emitting mode; and
  the other face being configured to transmit from the body light emitted by the at least one pn-junction.

The contacts may be provided adjacent the first face and the other face may be opposite to the first face.

The contacts may form part of a configuration of insulating and interconnect layers adjacent the first face and at least part of the configuration may be adapted or processed to reflect emitted light towards the other face.

The adaptation of the insulating and interconnect configuration may include intentional placement, geometric dimensioning or physical modification by means of chemical or physical shaping or surface alteration of the insulating and interconnect layers to reflect more light towards the other face or to change the angle of light reflection towards the other face.

The indirect bandgap semiconductor material may comprise any suitable indirect bandgap semiconductor material, such as germanium or silicon or alloys thereof. Preferably the material is silicon.

The pn-junction may be configured to be driven into a reverse biased light emitting breakdown mode, such as field emission or avalanche breakdown mode.

The emitted light preferably comprises wavelengths in excess of 1 μm and in the near infrared (NIR) part of the spectrum.

The at least one pn-junction may form part of any suitable light emitting arrangement and in any suitable configuration of regions of a first doping kind and a second doping kind, such as $n^+p$, $pn^+$, $n^+pn^+$, $p^+np^+$, $n^+np^+$ and $p^+pn^+$, so as to increase the NIR optical power usefully available at the other face of the body.

The other face may be configured as aforesaid through roughening, polishing, etching, shaping, coating or any other suitable method that would increase the optical power and/or improve a radiation pattern of the light transmitted through the other face.

At least one of a light coupler, such as optical fibre, and a light detector may be provided in light communicating relationship with the other face.

Also included within the scope of the invention is an integrated circuit comprising a light emitting device as defined hereinbefore integrated with other electronic components, such as transistors, and/or optical components. The integrated circuit may be a complementary metal-oxide-semiconductor (CMOS) microchip.

Yet further included within the scope of the present invention is a method of fabricating a light emitting device, the method comprising the steps of:
  forming at least one pn-junction towards a first face of a body of an indirect bandgap semiconductor material;
  providing contacts on the body for driving the pn-junction into a light emitting mode; and
  adapting another face of the body to transmit from the body light emitted by the pn-junction.

The other face may be opposite to the first face and the method may comprise the step of providing the contacts adjacent the first face.

The contacts may form part of a configuration of insulating and interconnect layers adjacent the first face and the method may comprise at least one of processing, configuring and adapting the configuration so as to reflect emitted light towards the other face.

The body may be formed from silicon and the pn-junction may be configured and connected to be biased into a reverse biased breakdown light emitting mode.

The other face may be adapted by at least one of roughening, polishing, etching, shaping and coating.

Yet further included within the scope of the present invention is a method of coupling light comprising the steps of:
  generating light by driving a pn-junction located towards a first face of a body of an indirect bandgap semiconductor material into a reverse biased light emitting mode; and coupling generated light having a wavelength longer than 1 μm from the body through another face of the body.

The body may comprise bulk silicon and the method may comprise the step of allowing generated light having wavelengths shorter than 1 μm to be absorbed in or by the bulk silicon, so that only generated light with wavelengths longer than 1 μm is coupled through the other face.

The method may comprise the step of providing at least one of a light coupler, such as optical fibre, and a light detector in light communicating relationship with the other face.

DESCRIPTION OF A PREFERRED EMBODIMENT OF THE INVENTION

The invention will now further be described, by way of example only, with reference to the accompanying diagram, which is a diagrammatic illustration of an example embodiment complementary metal-oxide-semiconductor (CMOS) integrated circuit (IC) in the form of a microchip 10 comprising a light emitting device 11.

The device 11 and chip 10 comprises a body 12 of bulk silicon having a first face 14 and at least one other face 16. The body comprises at least one pn-junction 18 located towards the first face 14 and configured to be driven via contacts (not shown) on the body and preferably adjacent the first face 14 into a light emitting mode. A face of the body other than the first face, preferably the opposite face 16, is adapted and/or used to transmit from the body 12 light emitted by the at least one pn-junction.

The emitted light comprises wavelengths in a band from about 350 nm to about 1.7 μm. Emitted or generated light with wavelengths shorter than 1 μm is absorbed in the silicon body so that emitted or generated light in the near infrared (NIR) part of the spectrum with wavelengths longer than 1 μm is transmitted through the other face.

Coupling means 20, for example an optical fibre, for coupling the emitted and transmitted light is provided adjacent to and in light communicating relationship with the other face 16. In other embodiments, light sensitive or detecting or receiving means may be so provided in light communicating relationship with the other face.

The aforementioned contacts may form part of a configuration 22 of insulating and metal interconnect layers adjacent the first face 14. At least part of the configuration 22, such as at least one of the insulating and metal layers is preferably processed or configured to reflect (as shown at A) light emitted by the at least one pn-junction 18 towards the other face 16.

The other face 16 of the chip body 12 may be adapted as aforesaid through roughening, polishing, etching, shaping, coating or any other method that would increase the optical power and/or improve the radiation pattern of the light emanating from the second face 16.

The chip 10 may also comprise other integrated optical and electronic components (not shown) which are interconnected by the aforementioned interconnect layers.

By electronically switching the avalanching pn-junction, NIR light may be modulated for use in data transmission along the fibre-optic cable 20, for example.

Hence, by utilizing a pn-junction 18 in reverse biased breakdown mode as a wide-band light source to emit NIR light, the bulk silicon body 12 which is transparent for NIR light and the other or opposite face 16 of the body to transmit the emitted light, it is believed that the disadvantages of the prior art may be overcome in an unexpected way. Furthermore, the source is capable of fast switching, so that CMOS IC's may be used as NIR light source hosts for optical communication by using the wide-band electroluminescent spectrum of the avalanching pn-junction and extracting the light at the other or opposite face 16 of the body 12 of the CMOS IC 10.

The invention claimed is:

1. A light emitting device comprising:
    a body of an indirect bandgap semiconductor material including first and second oppositely doped regions, the body having a first face and at least one other face;
    a light-emitting source comprising at least one pn-junction including at least a first part extending between the first and second oppositely doped regions of the body towards the first face at an angle incident to the first face, whereby a first part of the first face is located to one side of the first part of the pn-junction and a second part of the first face is located to another side of the first part of the pn-junction; and
    electrical contacts on the first and second parts of the first face for driving the at least one pn-junction into a reverse biased breakdown light emitting mode, whereby the light emitting source emits light
    the at least one other face being configured to transmit from the body light emitted by the light-emitting source.

2. The light emitting device as claimed in claim 1, wherein the other face is opposite to the first face.

3. The light emitting device as claimed in claim 1, wherein the contacts form part of a configuration of insulating and interconnect layers adjacent to the first face, and wherein at least part of the configuration is adapted to reflect the emitted light towards the other face.

4. The light emitting device as claimed in claim 1, wherein the indirect bandgap semiconductor material comprises silicon.

5. The light emitting device as claimed in claim 1, wherein the at least one pn-junction forms part of an arrangement of pn-junctions.

6. The light emitting device as claimed in claim 1 further comprising at least one of a light coupler and a light detector in light communicating relationship with the other face.

7. An integrated circuit comprising a light emitting device as claimed in claim 1 integrated with other components.

8. The integrated circuit as claimed in claim 7 which is a complementary metal-oxide-semiconductor (CMOS) microchip.

9. The light emitting device as claimed in claim 2, wherein the at least one pn-junction is spaced from the opposite face by another region of the body of an indirect bandgap semiconductor material.

10. The light emitting device as claimed in claim 9, wherein the at least one pn-junction further comprises a second part which extends substantially parallel to the first face and wherein the second part of the pn junction is spaced from the opposite face by the second doped region of the body of an indirect bandgap semiconductor material.

11. The light emitting device as claimed in claim 2, wherein the first doped region is in the form of a pocket in the second doped region and located adjacent to the first face of the body, so that the first part of the first face is provided by the first doped region and the second part of the first face is provided by the second doped region.

12. A method of fabricating a light emitting device, the method comprising:
    forming a light-emitting source in a body of an indirect bandgap semiconductor material having a first face and at least one other face by providing first and second oppositely doped regions in the body which together form at least one pn-junction comprising at least a first part extending between the first and second oppositely doped regions towards the first face at an angle incident to the first face, whereby a first part of the first face is located to one side of the first part of the pn-junction and a second part of the first face is located to another side of the first part of the pn-junction;

providing electrical contacts on the first and second parts of the first face the body for driving the at least one pn-junction into a reverse biased breakdown light emitting mode, whereby the light emitting source emits light; and adapting the at least one other face of the body to transmit from the body light emitted by the light emitting source.

13. The method as claimed in claim 12, wherein the other face is opposite to the first face.

14. The method as claimed in claim 12, wherein the electrical contacts form part of a configuration of insulating and interconnect layers adjacent to the first face, and wherein the method further comprises at least one of processing and configuring at least part of the configuration so as to reflect the light emitted by the light emitting source towards the other face.

15. The method as claimed in claim 12, wherein the indirect bandgap semiconductor material comprises silicon.

16. The method as claimed in claim 12, wherein the other face is adapted by at least one of roughening, polishing, etching, shaping and coating.

17. A method of coupling light comprising:

utilizing a light emitting source located in a body of an indirect bandgap semiconductor material including first and second oppositely doped regions, the body having a first face and at least one other face, the light emitting source comprising at least one pn junction comprising at least a first part extending towards the first face between the first and second oppositely doped regions of the body and at an angle incident to the first face, whereby a first part of the first face is located to one side of the first part of the pn-junction and a second part of the first face is located to another side of the first part of the pn-junction;

generating light by driving the at least one pn junction into a reverse biased breakdown light emitting mode via electrical contacts on the first and second parts of the first face; and coupling generated light having a wavelength longer than a first wavelength from the body through the at least one other face of the body.

18. The method as claimed in claim 17 further comprising allowing generated light having wavelengths shorter than the first wavelength to be absorbed in the body.

19. The method as claimed in claim 18, wherein the body comprises bulk silicon and wherein the first wavelength is 1 µm.

* * * * *